(12) United States Patent
Chang et al.

(10) Patent No.: US 6,700,438 B2
(45) Date of Patent: Mar. 2, 2004

(54) DATA COMPARATOR USING NON-INVERTING AND INVERTING STROBE SIGNALS AS A DYNAMIC REFERENCE VOLTAGE AND INPUT BUFFER USING THE SAME

(75) Inventors: Chi Chang, Taipei (TW); Yuang-Tsang Liaw, Taipei Hsien (TW)

(73) Assignee: Via Technologies, Inc., Taipei (TW)

( * ) Notice: Subject to any disclaimer, the term of this patent is extended or adjusted under 35 U.S.C. 154(b) by 0 days.

(21) Appl. No.: 10/138,501

(22) Filed: May 6, 2002

(65) Prior Publication Data

US 2002/0167339 A1 Nov. 14, 2002

Related U.S. Application Data

(60) Provisional application No. 60/290,471, filed on May 11, 2001.

(30) Foreign Application Priority Data

Nov. 22, 2001 (TW) .......................... 90128926 A

(51) Int. Cl.[7] .............................................. H03K 5/22
(52) U.S. Cl. ..................... 327/562; 330/261; 327/65; 327/71

(58) Field of Search .......................... 327/65, 560, 561, 327/562, 71, 75; 330/252, 261

(56) References Cited

U.S. PATENT DOCUMENTS

| 4,460,874 A | * | 7/1984 | Haque ........................ 330/261 |
| 5,117,199 A | * | 5/1992 | Wang et al. ................. 330/252 |
| 6,011,435 A | * | 1/2000 | Takeyabu et al. ........... 330/252 |
| 6,563,348 B1 | * | 5/2003 | Beck et al. .................... 327/94 |

FOREIGN PATENT DOCUMENTS

JP          0212456    *  3/1906

* cited by examiner

*Primary Examiner*—Dinh T. Le
(74) *Attorney, Agent, or Firm*—Rabin & Berdo, P.C.

(57) ABSTRACT

A data comparator using a dynamic reference voltage and an input buffer using the same. The data comparator comprises a comparator circuit for receiving a data signal and a pair of non-inverting/inverting signals, which are periodic and complementary. The output signal is generated by comparing twice the data signal with the sum of the non-inverting signal and the inverting signal. The non-inverting/inverting signals are used as a dynamic reference voltage in the data comparator.

11 Claims, 4 Drawing Sheets

DATA COMPARATOR USING NON-INVERTING AND INVERTING STROBE SIGNALS AS A DYNAMIC REFERENCE VOLTAGE AND INPUT BUFFER USING THE SAME

This application claims the benefit of Provisional Application No. 60/290,471 filed May 11, 2001.

BACKGROUND OF THE INVENTION

1. Field of the Invention

The present invention is related to an electronic circuit technology, more specifically, to a data comparator, which utilizes a pair of non-inverting and inverting strobe signals as a dynamic reference voltage, and a data buffer using the same.

2. Description of the Prior Art

FIG. 1 (Prior Art) is a circuit diagram of a conventional input buffer in the digital circuits, which usually includes a data comparator 10 and a strobe signal comparator 20. Generally speaking, non-inverting/inverting strobe signals (STROB/STROB#) constitute a periodic differential signal with a T/2 phase difference, where T represents the period of these two strobe signals. Strobe signal comparator 20 receives the non-inverting/inverting strobe signals (STROB/STROB#) via its positive/negative input terminals, respectively, and produces a data-sampling strobe signal (STB) in view of crossing points of these two strobe signals. Since the differential signal of the non-inverting/inverting signals (STROB/STROB#) has a T/2 phase difference, adjacent rising/falling edges of the data-sampling strobe signal (STB) are spaced out T/2 apart. In addition, data comparator 10 receives a data signal (DATA) and a reference voltage (VREF) via its positive/negative input terminals, respectively, and compares them based on the rising/falling edges of the data-sampling strobe signal (STB), for determining logic levels of the output signal (DOUT), such as "1" or "0."

FIG. 2 (Prior Art) is a timing diagram illustrating the relationships between the data signal (DATA), the reference voltage (VREF) and the non-inverting/inverting strobe signal (STROB/STROB#) in the conventional input buffer. As shown in the figure, a crossing point T1 exists when the level of the non-inverting strobe signal (STROB) is going down and the level of the inverting strobe signal (STROB#) is going up. At this time, the level of the data signal (DATA) is lower than the reference voltage (VREF) and thus the output signal (DOUT) is set to be "0." On the other hand, a crossing point T2 exists when the level of the non-inverting signal (STROB) is going up and the level of the inverting signal (STROB#) is going down. At this time, the level of the data signal (DATA) is higher than the reference voltage (VREF) and thus the output signal (DOUT) is set to be "1."

The data comparator 10 of the conventional input buffer is called a pseudo-differential comparator, and compares an arbitrary data signal with a constant reference voltage. In addition, the strobe signal comparator 20 is called a fully differential comparator, comparing a pair of strobe signals in the differential form. In the conventional case, there is a T/4 phase difference between the data-sampling strobe signal (STB) and the data signal (DATA) for latching the data. A variety of industry standards, such as AGP4X, VLINK and Pentium 4 buses, adopt this kind of the center-aligned scheme.

However, the conventional data comparators still suffer from some disadvantages. As shown in FIG. 1, the data comparator 10 determines the logic levels of the output data (DOUT) based on the difference between the data signal (DATA) and the reference voltage (VREF). In fact, the slew rate of the data signal (DATA) and the variation of the reference voltage (VREF) may change the timing of the output signal (DOUT), which is dangerous for high-speed input/output buses which has very short bit time.

FIG. 3 (Prior Art) is a timing diagram for illustrating the neighborhood of a crossing point of the data signal (DATA) and the reference voltage (VREF), explaining the influence of the slew rate of the data signal on the output signal. Suppose that data comparator 10 needs a voltage difference $\Delta V_m$ to detect the signal. In FIG. 3, numeral 1 stands for a first slew rate case and numeral 3 stands for a second slew rate case, where the first slew rate is higher than the second slew rate. Thus, the output signal (DOUT) suffers from a timing shift At when the slew rate of data signal (DATA) changes from the first slew rate case to the second slew rate case. Furthermore, the reference voltage (VREF) is usually a DC voltage, which is liable to be coupled by electrostatic discharge (ESD) devices or adjacent signal/power sources along the paths, which also affects the latch timing of the output signal (DOUT).

SUMMARY OF THE INVENTION

Therefore, the object of the present invention is to provide a data comparator structure and an input buffer using the same which can solve the above-mentioned problems, such as the influence of the slew rate and the instability of the reference voltage on the timing of the output signal.

The present invention achieves the above-indicated objects by providing a data comparator, which can be utilized in the input buffer circuit for processing the received data signal and comparing it with a dynamic reference voltage created by a pair of non-inverting/inverting signals. The data comparator comprises a comparator circuit for receiving a data signal and the non-inverting/inverting signals. The output signal is generated by comparing twice the data signal with the sum of the non-inverting signal and the inverting signal. In the preferred embodiment, the non-inverting signal and the inverting signal are periodic and complementary, coming from the same power/ground source as the data signal, such as strobe signals for creating the sampling signal in the data buffer. Thus, in the present invention, the non-inverting/inverting signals are used as a dynamic reference voltage to overcome the problems in the prior art.

In addition, the comparator circuit can comprise a current source having a first end coupled to a first high voltage, a load component with a current mirror configuration having a first end and a second end, a first transistor having a gate electrode coupled to the data signal and source/drain electrodes coupled to a second end of the current source and the first end of the load component, a second transistor having a gate electrode coupled to the data signal and source/drain electrodes coupled to the second end of the current source and the first end of the load component, a third transistor having a gate electrode coupled to the non-inverting signal and source/drain electrodes coupled to the second end of the current source and the second end of the load component, and a fourth transistor having a gate electrode coupled to the inverting signal and source/drain electrodes coupled to the second end of the current source and the second end of the load component. The output signal is a voltage on a node coupled between the first transistor and the load component.

In addition, the present invention also provides a data comparator, which comprises a two-input differential comparator circuit having a first transistor for receiving a data signal from and a second transistor for receiving a non-inverting signal, a third transistor in parallel with the first transistor for receiving the data signal and a fourth transistor in parallel with the second transistor for receiving an inverting signal. The comparator structure is used to compare twice the data signal with the sum of the non-inverting signal and the inverting signal.

BRIEF DESCRIPTION OF THE DRAWINGS

The following detailed description, given by way of example and not intended to limit the invention solely to the embodiments described herein, will best be understood in conjunction with the accompanying drawings, in which.

DETAILED DESCRIPTION OF THE INVENTION

The present invention discloses a novel data comparator applied in an input buffer, in which a pair of non-inverting/inverting signals are substituted for the conventional constant reference voltage for solving the problems of the conventional data comparator. The non-inverting/inverting signal mentioned above are preferably the non-inverting/inverting strobe signals (STROB/STROB#), which come from the same power/ground source as the data signal (DATA).

Figure 1:
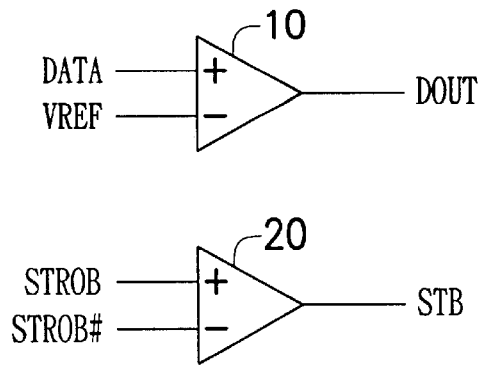
FIG. 1 (Prior Art) is a circuit diagram of a conventional input buffer.
Figure 2:
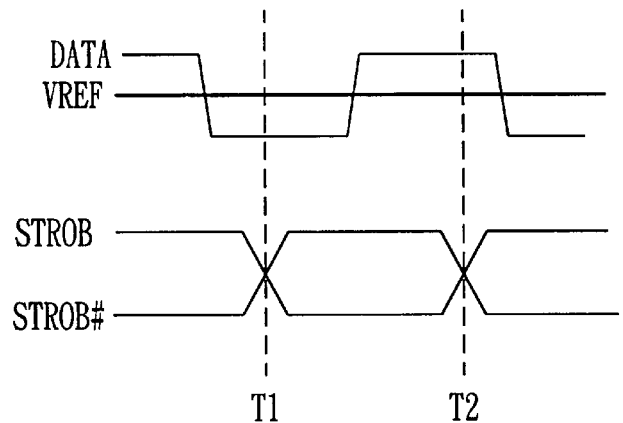
FIG. 2 (Prior Art) is a timing diagram illustrating the relationships between the data signal, the reference voltage and the non-inverting/inverting strobe signal in the conventional input buffer.
Figure 3:
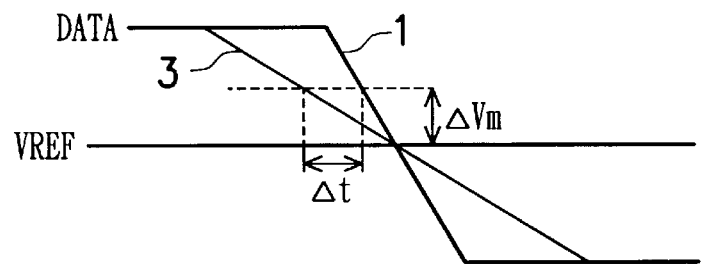
FIG. 3 (Prior Art) is a timing diagram illustrating the neighborhood of a crossing point of the data signal DATA and the reference voltage.
Figure 4:
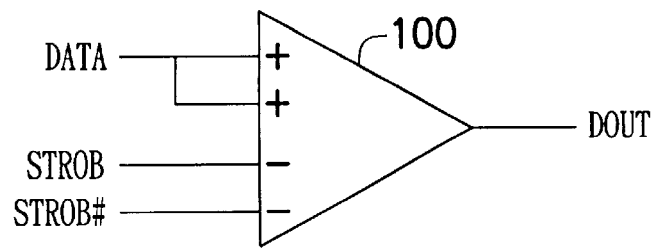
FIG. 4 is a schematic diagram of the data comparator according to the preferred embodiment of the present invention.

FIG. 4 is a schematic diagram of the data comparator in the preferred embodiment. As shown in the figure, the data comparator 100 has four input terminals, including two positive input terminals (denoted by "+") for receiving the data signal (DATA) and two negative input terminals (denoted by "−") for receiving the non-inverting/inverting strobe signals (STROB/STROB#). As described above, the non-inverting/inverting signals are periodic and complementary. The function of the data comparator 100 is to compare twice the data signal (DATA) with the sum of the non-inverting/inverting signals and to produce the output signal (DOUT) according to the comparison result.

Figure 5:
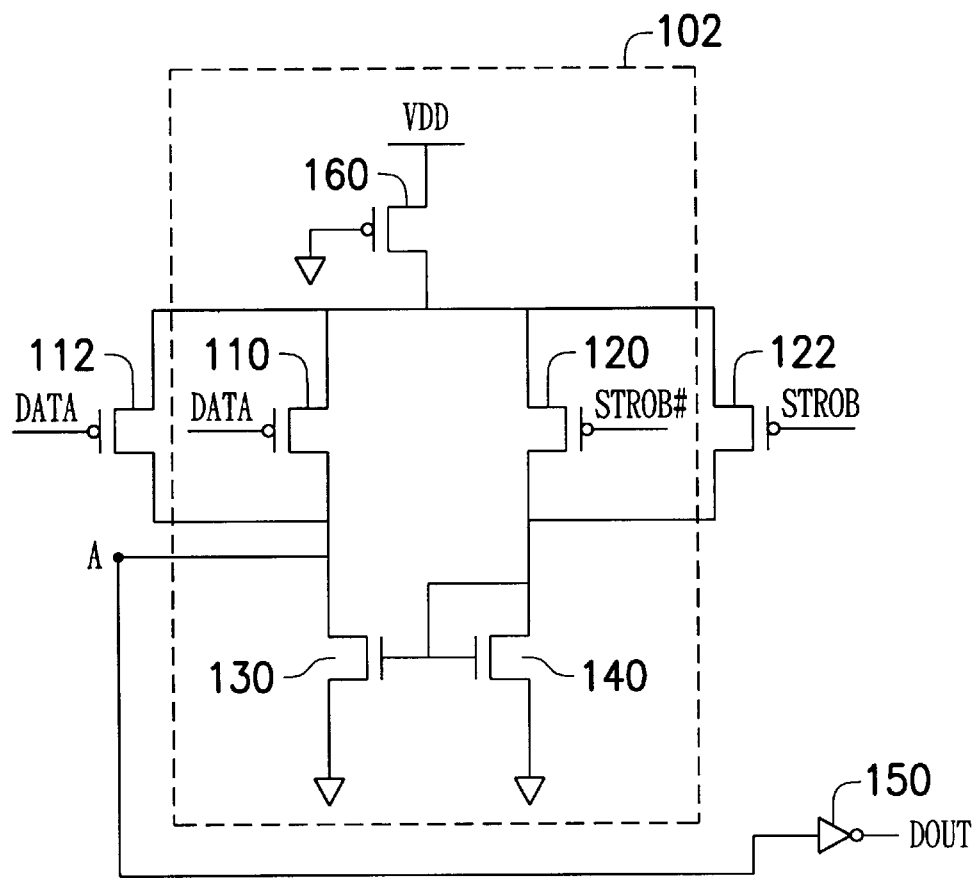
FIG. 5 is a detailed circuit diagram of the data comparator according to the preferred embodiment of the present invention.

FIG. 5 is a detailed circuit diagram of the data comparator 100 according to the preferred embodiment of the present invention. It is noted that FIG. 5 only illustrates one possible embodiment of the data comparator in the present invention. As shown in FIG. 5, data comparator 100 includes a PMOS transistor 160 serving as a current source, four PMOS transistors 110, 112, 120 and 122 for receiving two sets of the data signal (DATA) and the non-inverting/inverting strobe signals (STROB/STROB#), and two NMOS transistors 130 and 140 serving as a load in a current mirror structure. On the other hand, PMOS transistors 160, 110 and 120 and NMOS transistors 130 and 140 constitute a basic two-input differential comparator 102. The PMOS transistor 110 in parallel with the PMOS transistor 112 and the PMOS transistor 112 receive the data signal (DATA) via their gate electrodes. The PMOS transistor 120 in parallel with the PMOS transistor 122 and the PMOS transistor 122 receive the non-inverting/inverting strobe signals (STROB/STROB#) via their gate electrodes. In addition, an additional inverter 150 is used to generate the output signal (DOUT) since the voltage at terminal A and the data signal (DATA) are out of phase.

According to FIG. 4 and FIG. 5, data comparator 100 uses the non-inverting/inverting strobe signals (STROB/STROB#) as a dynamic reference voltage for sampling the data signal (DATA). In fact, no matter what the logic state of the data signal (DATA) is, such as "1" or "0", there is a constant voltage difference between the twice data signal (DATA) and the sum of the non-inverting/inverting strobe signals (STROB/STROB#).

Figure 6:
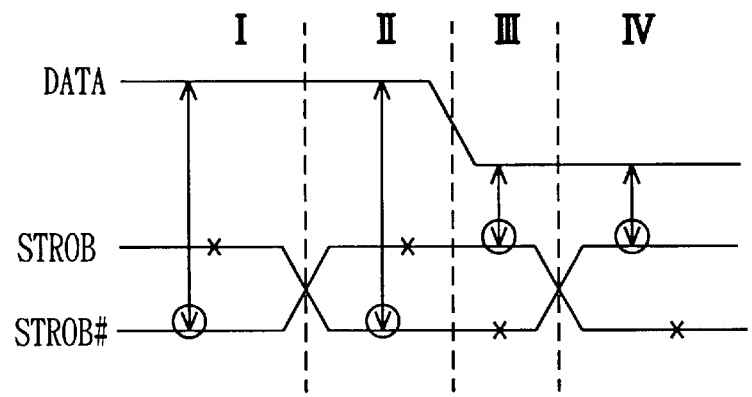
FIG. 6 is a schematic diagram illustrating the relationships between the non-inverting/inverting strobe signals STROB/STROB# and the data signal DATA in the preferred embodiment of the present invention.

FIG. 6 is a schematic diagram illustrating the relationships between the non-inverting/inverting strobe signals (STROB/STROB#) and the data signal (DATA) in the preferred embodiment of the present invention. Suppose that the amplitudes of the data signal (DATA) and the non-inverting/inverting strobe signals (STROB/STROB#) vary between +Vf and −Vf. There exist four cases in the figure:

(I) The amplitude of the data signal (DATA) is +Vf and the amplitudes of the non-inverting/inverting strobe signal (STROB/STROB#) are +Vf and −Vf, respectively;

(II) The amplitude of the data signal (DATA) is +Vf and the amplitudes of the non-inverting/inverting strobe signal (STROB/STROB#) are −Vf and +Vf, respectively;

(III) The amplitude of the data signal (DATA) is −Vf and the amplitudes of the non-inverting/inverting strobe signal (STROB/STROB#) are −Vf and +Vf, respectively; and (IV) The amplitude of the data signal (DATA) is −Vf and the amplitudes of the non-inverting/inverting strobe signal (STROB/STROB#) are +Vf and −Vf, respectively.

In any one case, one of strobe signal (STROB/STROB#) cancels one set of the data signal (DATA) (denoted by a symbol "X") and another is subtracted to the remaining set of the data signal (DATA) (denoted by a symbol "O"). Thus, the resulting voltage difference is +2Vf or −2Vf. When the data signal DATA is switching, the voltage difference at the input terminals of the input buffer will have two times of the slew rate of the data signal (DATA). Once this voltage difference becomes zero, it means that the output signal (DOUT) is going to change its output value. In addition, the common mode noises between the data signal (DATA) and the strobe signals (STROB/STROB#) can also be eliminated since they come from the same power/ground source.

A further analysis of the relationships between various waveforms of the data signal (DATA) and the non-inverting/inverting strobe signals (STROB/STROB#) is described as follows.

Figure 7:
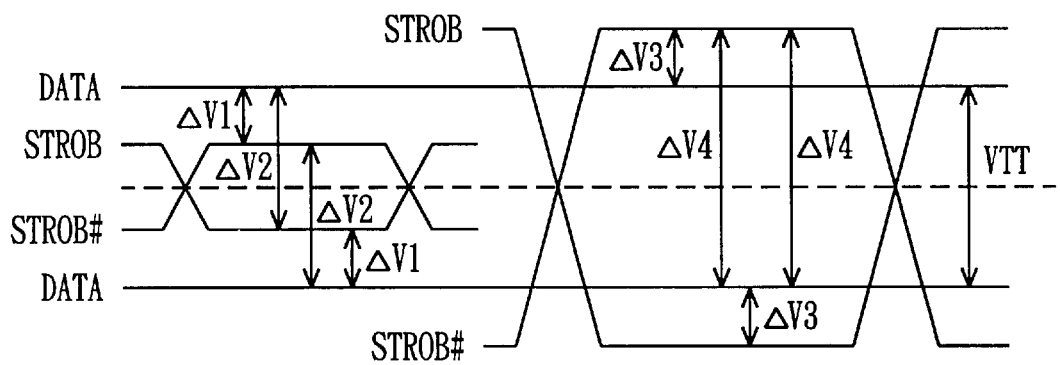
FIG. 7 is a schematic diagram illustrating the relationships between the non-inverting/inverting strobe signals STROB/STROB# and the data signal DATA with different amplitudes in the preferred embodiment of the present invention.

Suppose that the peak-to-peak amplitude of data signal (DATA) is VTT. When the waveforms of the non-inverting/inverting strobe signals (STROB/STROB#) are symmetric at the center of the peak-to-peak amplitude VTT, the apparent voltage difference at the input terminals of the data comparator 100 is determined by the magnitude of the data signal (DATA). FIG. 7 is a schematic diagram illustrating the relationships between the non-inverting/inverting strobe signals (STROB/STROB#) and the data signal (DATA). As shown in the figure, when the voltage amplitude of the non-inverting/inverting strobe signals (STROB/STROB#) is smaller than the voltage amplitude of the data signal (DATA) and symmetric at the center of the peak-to-peak amplitude VTT, the apparent voltage difference at the input terminals of data comparator 100 is $\Delta V1+\Delta V2=VTT$. When the voltage amplitude of the non-inverting/inverting strobe signals (STROB/STROB#) is larger than that of the data signal (DATA) and symmetric at the center of the peak-to-peak amplitude VTT, the apparent voltage difference at the input terminals of data comparator 100 is $\Delta V4-\Delta V3=VTT$. Thus, the data comparator 100 of the preferred embodiment of the present invention can still properly work even if the voltage amplitude of the non-inverting/inverting strobe signals (STROB/STROB#) is unequal to that of the data signal (DATA.)

Figure 8:
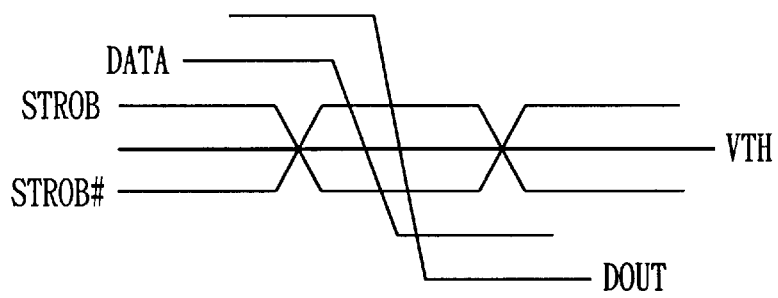
FIG. 8 is a schematic diagram illustrating the relationship between the data signal DATA and the output signal DOUT in the preferred embodiment of the present invention.

Besides, the skew of crossing points of the non-inverting/inverting strobe signals (STROB/STROB#) will not affect the output timing of the data output signal (DOUT) since sensing the voltage difference of the input terminals of the data comparator 100 depends on the rising/falling edges of the data signal (DATA). FIG. 8 is a schematic diagram illustrating the relationship between the data signal DATA and the output signal DOUT in the preferred embodiment. Thus, a center voltage of the non-inverting/inverting strobe signals (STROB/STROB#), namely VTH, is regarded as the threshold voltage for determining logic levels of the data signal (DATA). The output timing of the data output signal (DOUT) is determined by comparing the data signal (DATA) with the threshold voltage (VTH). Accordingly, the skew of the crossing points of the non-inverting/inverting strobe signals (STROB/STROB#) will not affect the output timing of the data output signal (DOUT).

Figure 9:
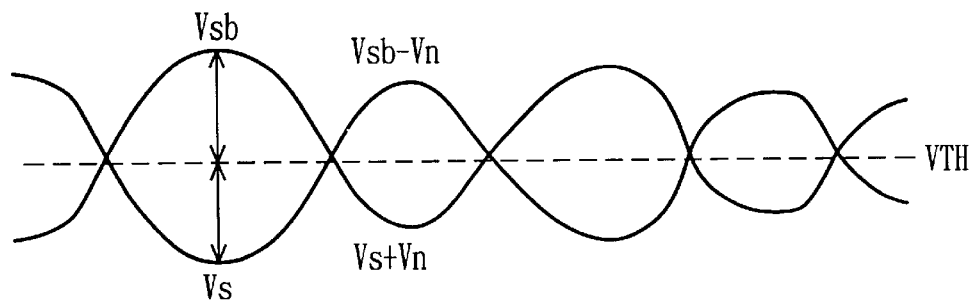
FIG. 9 is a timing diagram of the symmetric case of the non-inverting/inverting strobe signals in the present invention.
Figure 10:
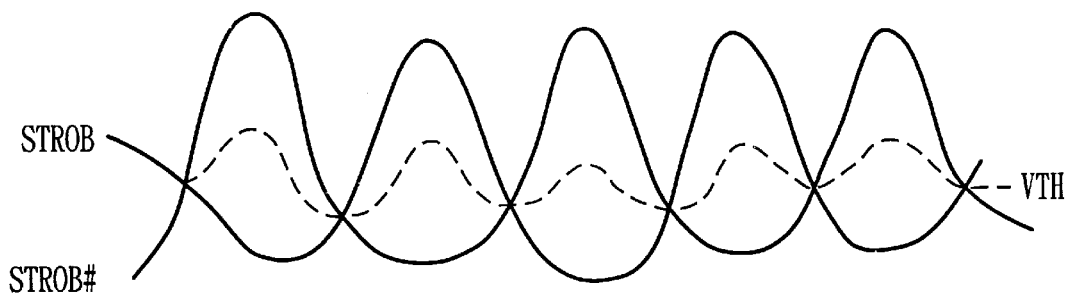
FIG. 10 is a timing diagram of the unsymmetric case of the non-inverting/inverting strobe signals in the present invention.

In principle, the threshold voltage (VTH) will keep constant as long as the waveform of the non-inverting/inverting strobe signals (STROB/STROB#) maintains symmetric. FIG. 9 and FIG. 10 illustrate the symmetric case and the asymmetric case of the non-inverting/inverting strobe signals (STROB/STROB#), respectively. In FIG. 9, the non-inverting/inverting strobe signals (STROB/STROB#) suffer from amplitude distortion but still keep their waveform symmetry. Suppose that the amplitudes of the non-inverting/inverting strobe signals are Vsb and Vs, respectively, the threshold voltage VTH is (Vsb+Vs)/2. When their amplitudes change to Vsb−Vn and Vs+Vn, the threshold voltage VTH is still maintained at (Vsb+Vs)/2. On the other hand, in FIG. 10, the waveforms of the non-inverting/inverting strobe signals (STROB/STROB#) are asymmetric. Thus, the threshold voltage is unstable, which affects the output timing of the data output signal (DOUT).

Generally speaking, the non-inverting/inverting strobe signals (STROB/STROB#) come from the same structure of I/O pads with different phases and travel through the same substrate, bonding pads, printed circuit board (PCB) routing and traces inside the chip. Therefore, the non-inverting/inverting strobe signals (STROB/STROB#) have essential symmetry in principle. As well, the noises will be cancelled out and result in a relative quiet threshold voltage (VTH). Similarly, inductance noises from the substrate and transmission lines, denoted by $\Delta V=L\times\Delta I/\Delta t$, can be also cancelled since the non-inverting/inverting strobe signals have currents with opposite directions.

The advantages of the data comparator and the input buffer using the data comparator disclosed in the preferred embodiment are summarized as follows:

1. The twice data signal (DATA) can create a sharper transition edge at the input terminals of data comparator 100 than the prior art. The skew caused by the skew rate or waveform distortion in the comparator of the preferred embodiment only have half of that of the conventional pseudo-differential comparator.

Figure 11:
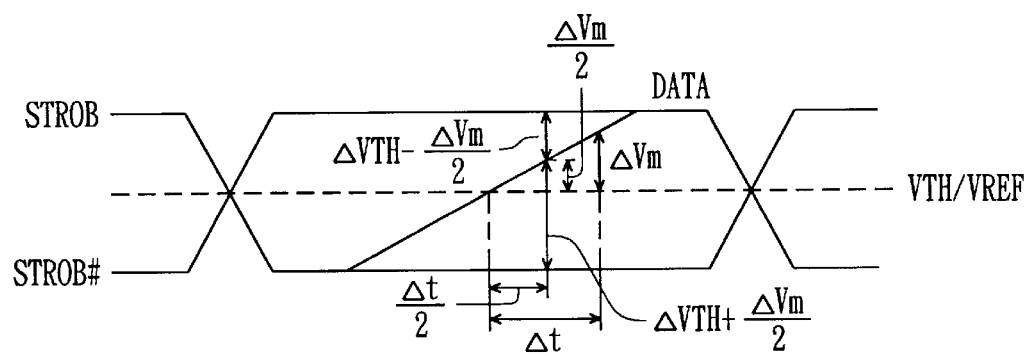
FIG. 11 is a schematic diagram illustrating the comparison between the data comparator of the present invention and the conventional data comparator.

FIG. 11 is a schematic diagram illustrating the comparison between the data comparator of the present invention and the conventional art. As shown in FIG. 11, the data comparator of the present invention compares the data signal (DATA) with the non-inverting/inverting strobe signals (STROB/STROB#), but the conventional data comparator compares the data signal with a constant reference voltage (VREF). Suppose that the minimum voltage difference required for the detection of the data comparator is $\Delta Vm$ and the waveform variation of the data signal (DATA) is linear. In the conventional case, the time for reaching a voltage difference $\Delta Vm$ between the data signal (DATA) and the reference voltage (VREF), or reaching an apparent voltage difference $\Delta Vm$ at the input terminals of the data comparator, is defined as $\Delta t$. In the present invention, when the voltage difference between the data signal (DATA) and the threshold voltage VTH is $\Delta Vm/2$, which only requires $\Delta t/2$, the apparent voltage difference at the input terminals of the data comparator 100 is $(\Delta VTH+\Delta Vm/2)-(\Delta VTH-\Delta Vm/2)=Vm$. Thus, the data comparator of the present invention is twice as fast as the conventional data comparator.

2. According to the previous analysis, the threshold voltage VTH is determined by the middle point of the non-inverting/inverting strobe signals (STROB/STROB#). These two complementary signals, which toggle like a pair of differential clocks, bear the same process/voltage/temperature (PVT) variations, the same substrate and the same PCB routing and silicon traces. The phase and amplitude noises thereon can be cancelled out. In addition, it is easier to maintain the stability of the threshold voltage (VTH) in the present invention, which can be achieved by keeping the waveform symmetry of the non-inverting/inverting strobe signals (STROB/STROB#), than that of the constant reference voltage (VREF) in the prior art.

3. In the present invention, the data comparator in the present invention can reject the common-mode noises, such as power/ground noises, by the pair of the data signal (DATA) and the non-inverting strobe signal STROB, or the pair of the data signal (DATA) and the inverting strobe signal (STROB#). In addition, the non-inverting/inverting strobe signals (STROB/STROB#) connected at the same side of the data comparator can reduce the amplitude/phase noises, such as substrate and inductance noises, to maintain the threshold voltage (VTH) constant. Consequently, in the present invention, the data rate can be increased and the noise margin can be maintained because of the improved signal-to-noise ratio.

4. Because the output timing of the data output signal DOUT will not be affected by the skew of the crossing points of the non-inverting/inverting strobe signals (STROB/STROB#), the non-inverting/inverting strobe signals (STROB/STROB#) can easily be distributed to the data pads without worrying about the extra skew between the strobe signals (STROB/STROB#) and the data signal (DATA) due to routing. However, it is important that the non-inverting/inverting strobe signals (STROB/STROB#) have the same routing to keep them as symmetric as possible.

While the invention has been described by way of example and in terms of the preferred embodiment, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A data comparator, comprising:
    a comparator circuit for receiving a data signal, a non-inverting signal and an inverting signal and outputting an output signal by comparing twice the data signal with the average of the non-inverting signal and the inverting signal, wherein the non-inverting signal and the inverting signal are periodic and complementary, and twice the data signal is generated according to a first difference between the data signal and the non-inverting signal and a second difference between the data signal and the inverting signal.

2. The data comparator as recited in claim 1, wherein an average value between the non-inverting signal and the inverting signal remains unchanged.

3. The data comparator as recited in claim 1, wherein the comparator circuit comprises:
    a current source having a first end coupled to a first high voltage;
    a load component with a current mirror configuration having a first end and a second end;
    a first transistor having a gate electrode coupled to the data signal, and source/drain electrodes coupled to a second end of the current source and the first end of the load component, respectively;
    a second transistor having a gate electrode coupled to the data signal, and source/drain electrodes coupled to the second end of the current source and the first end of the load component, respectively;
    a third transistor having a gate electrode coupled to the non-inverting signal, and source/drain electrodes coupled to the second end of the current source and the second end of the load component, respectively; and
    a fourth transistor having a gate electrode coupled to the inverting signal, and source/drain electrodes coupled to the second end of the current source and the second end of the load component, respectively;
    wherein the output signal is a voltage on a node coupled between the first transistor and the load component.

4. The data comparator as recited in claim 1, wherein the inverting signal and the non-inverting signal are strobe signals and come from the same power/ground source of the data signal.

5. A data comparator, comprising:
    a two-input differential comparator circuit having a first transistor for receiving a data signal, a second transistor for receiving a non-inverting signal and an output terminal for outputting an output signal;
    a third transistor in parallel with the first transistor for receiving the data signal;
    a fourth transistor in parallel with the second transistor for receiving an inverting signal;
    the non-inverting signal and the inverting signal being periodic and complementary; and
    the output signal being determined by comparing twice the data signal with the sum of the non-inverting signal and the inverting signal.

6. The data comparator as recited in claim 5, wherein an average value between the non-inverting signal and the inverting signal remains unchanged.

7. The data comparator as recited in claim 5, wherein the inverting signal and the non-inverting signal are strobe signals and come from the same power/ground source of the data signal.

8. An input buffer comprising:
    a strobe signal comparator for generating a data-sampling strobe signal by a non-inverting strobe signal and an inverting strobe signal, the non-inverting strobe signal and inverting strobe signal being periodic and complementary; and
    a data comparator for generating an output signal from a data signal according to the data-sampling strobe signal, the data comparator having a comparator circuit for comparing twice the data signal with the sum of the non-inverting strobe signal and the inverting strobe signal.

9. The data buffer as recited in claim 8, wherein the comparator circuit comprises:
    a two-input differential comparator circuit having a first transistor for receiving the data signal, a second transistor for receiving a non-inverting signal and an output terminal for outputting the output signal;
    a third transistor in parallel with the first transistor for receiving the data signal; and
    a fourth transistor in parallel with the second transistor for receiving an inverting signal.

10. The data buffer as recited in claim 8, wherein an average value between the non-inverting strobe signal and the inverting strobe signal remains unchanged.

11. The data buffer as recited in claim 8, wherein the inverting signal and the non-inverting signal are strobe signals and come from the same power/ground source of the data signal.

* * * * *